United States Patent
Kim

(10) Patent No.: US 8,743,078 B2
(45) Date of Patent: Jun. 3, 2014

(54) DISPLAY APPARATUS

(75) Inventor: Eun-Ah Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 715 days.

(21) Appl. No.: 12/790,062

(22) Filed: May 28, 2010

(65) Prior Publication Data

US 2011/0032209 A1 Feb. 10, 2011

(30) Foreign Application Priority Data

Aug. 6, 2009 (KR) ........................ 10-2009-0072401

(51) Int. Cl.
*G06F 3/045* (2006.01)

(52) U.S. Cl.
USPC .............................. 345/174; 349/106; 445/24

(58) Field of Classification Search
USPC ..................... 345/173, 174, 204, 419, 55, 88;
178/18.07; 341/20; 349/106, 15, 61,
349/123, 12, 138, 153, 155, 156, 42, 65, 84,
349/96; 438/104, 30, 158, 151, 29, 487;
257/43, 59, 435, 459, 676, 705, 91, 99
See application file for complete search history.

(56) References Cited

U.S. PATENT DOCUMENTS

| | | | |
|---|---|---|---|
| 5,550,659 A | 8/1996 | Fujieda et al. | |
| 6,879,319 B2 | 4/2005 | Cok | |
| 6,980,184 B1 | 12/2005 | Stewart et al. | |
| 7,063,902 B2 | 6/2006 | Kikuchi et al. | |
| 7,133,032 B2 | 11/2006 | Cok | |
| 7,439,962 B2 | 10/2008 | Reynolds et al. | |
| 7,724,243 B2 | 5/2010 | Geaghan | |
| 7,737,637 B2 | 6/2010 | Koshihara et al. | |
| 7,864,503 B2 | 1/2011 | Chang | |
| 7,876,037 B2 * | 1/2011 | Koshihara et al. | 313/504 |
| 8,052,498 B2 * | 11/2011 | Chien et al. | 445/24 |
| 8,154,530 B2 | 4/2012 | Lin et al. | |
| 8,223,278 B2 * | 7/2012 | Kim et al. | 349/12 |
| 2002/0005928 A1 | 1/2002 | Hanakawa et al. | |
| 2003/0006971 A1 | 1/2003 | Blanchard | |

(Continued)

FOREIGN PATENT DOCUMENTS

DE 103 08 0514 9/2004
EP 1 930 968 A2 6/2008

(Continued)

OTHER PUBLICATIONS

Korean Office Action dated Feb. 16, 2011 issued by the KIPO for Korean Patent Application No. 10-2009-0072401, 4 pages.

(Continued)

*Primary Examiner* — Kevin M Nguyen
*Assistant Examiner* — Kenneth B Lee, Jr.
(74) *Attorney, Agent, or Firm* — Christie, Parker & Hale, LLP

(57) ABSTRACT

A display apparatus having an improved optical efficiency and a touch panel function, the display apparatus including a substrate; a display unit formed on the substrate and including a plurality of pixels; an encapsulation substrate disposed facing the display unit to encapsulate the display unit; an electrostatic capacitive pattern layer formed on the encapsulation substrate; and a black matrix layer formed between the substrate and the encapsulation substrate, and disposed to surround the plurality of pixels, wherein the plurality of pixels are disposed to correspond to the electrostatic capacitive pattern layer.

22 Claims, 7 Drawing Sheets

(56) References Cited

U.S. PATENT DOCUMENTS

| | | |
|---|---|---|
| 2003/0006972 A1 | 1/2003 | Blanchard |
| 2003/0199144 A1 | 10/2003 | Atobe et al. |
| 2003/0234759 A1 | 12/2003 | Berquist |
| 2004/0080267 A1 | 4/2004 | Cok |
| 2004/0095332 A1 | 5/2004 | Blanchard |
| 2005/0001964 A1 | 1/2005 | Kubo et al. |
| 2005/0030048 A1 | 2/2005 | Bolender et al. |
| 2005/0077820 A1 | 4/2005 | Onishi et al. |
| 2005/0093466 A1 | 5/2005 | Matsumoto |
| 2006/0033016 A1 | 2/2006 | Ogawa et al. |
| 2006/0097251 A1 | 5/2006 | Kang |
| 2006/0097991 A1 | 5/2006 | Hotelling et al. |
| 2006/0109222 A1 | 5/2006 | Lee et al. |
| 2006/0119590 A1 | 6/2006 | Park et al. |
| 2006/0232559 A1 | 10/2006 | Chien et al. |
| 2006/0250592 A1 | 11/2006 | Noguchi et al. |
| 2006/0274055 A1 | 12/2006 | Reynolds et al. |
| 2007/0046186 A1 | 3/2007 | Kim |
| 2007/0062739 A1 | 3/2007 | Philipp et al. |
| 2007/0216657 A1 | 9/2007 | Konicek |
| 2007/0240914 A1 | 10/2007 | Lai et al. |
| 2007/0242055 A1 | 10/2007 | Lai |
| 2007/0268243 A1 | 11/2007 | Choo et al. |
| 2008/0007534 A1 | 1/2008 | Peng et al. |
| 2008/0165158 A1 | 7/2008 | Hotelling et al. |
| 2008/0211395 A1 | 9/2008 | Koshihara et al. |
| 2008/0277259 A1 | 11/2008 | Chang |
| 2008/0278787 A1 | 11/2008 | Sasagawa |
| 2008/0278788 A1 | 11/2008 | Sasagawa |
| 2008/0309633 A1 | 12/2008 | Hotelling et al. |
| 2008/0309635 A1 | 12/2008 | Matsuo |
| 2009/0072724 A1 | 3/2009 | Seki et al. |
| 2009/0160822 A1 | 6/2009 | Eguchi et al. |
| 2009/0213090 A1 | 8/2009 | Mamba et al. |
| 2009/0313195 A1 | 12/2009 | McDaid et al. |
| 2010/0007616 A1 | 1/2010 | Jang |
| 2010/0013745 A1 | 1/2010 | Kim et al. |
| 2010/0110041 A1 | 5/2010 | Jang |
| 2010/0214247 A1 | 8/2010 | Tang et al. |
| 2011/0057893 A1 | 3/2011 | Kim et al. |

FOREIGN PATENT DOCUMENTS

| | | |
|---|---|---|
| EP | 1 930 968 A3 | 6/2011 |
| JP | 03-134925 | 6/1991 |
| JP | 07-036017 | 2/1995 |
| JP | 2003-196023 | 7/2003 |
| JP | 2005-521207 | 7/2005 |
| JP | 2005-339406 | 12/2005 |
| JP | 2006-302251 | 11/2006 |
| JP | 2007-086075 | 4/2007 |
| JP | 2007-299385 | 11/2007 |
| JP | 2008-009476 | 1/2008 |
| JP | 2008-310551 | 12/2008 |
| KR | 10-2003-0028973 | 4/2003 |
| KR | 10-2006-0044254 | 5/2006 |
| KR | 10-2006-73513 A | 6/2006 |
| KR | 10-0612240 B1 | 8/2006 |
| KR | 10-0743545 | 7/2007 |
| KR | 10-2007-0102414 | 10/2007 |
| KR | 10-2008-80913 A | 9/2008 |
| KR | 10-2008-0110477 | 12/2008 |
| KR | 10-2009-0058072 | 6/2009 |
| KR | 10-2009-68165 A | 6/2009 |
| TW | 200739402 | 10/2007 |
| WO | WO 03/079449 A1 | 9/2003 |
| WO | WO 2008/002043 A1 | 1/2008 |
| WO | WO 2008/032476 A1 | 3/2008 |
| WO | WO 2008/047990 A1 | 4/2008 |

OTHER PUBLICATIONS

English Machine translation for Japanese Publication 2007-086075, dated Apr. 5, 2007, listed above (37 pages), and corresponds to U.S. Publication 2007/0062739, dated Mar. 22, 2007.
EP Search Report dated Nov. 12, 2009 for European Patent application 09251664.0, (6 pages).
KIPO Office action dated Jan. 7, 2011 for Korean Patent application 10-2009-0053490, (3 pages).
KIPO Registration Determination Certificate dated Jun. 17, 2011 for Korean Patent application 10-2009-0053489, (5 pages).
KIPO Notice fo Allowance dated Oct. 31, 2011 for Korean Patent application 10-2009-0053490, (5 pages).
JPO Office action dated Feb. 28, 2012, for Japanese Patent application 2009-163880, (2 pages).
EP Office action dated May 22, 2012, for European Patent application 09251837.2, (9 pages).
SIPO Office action dated Jul. 24, 2012 for Chinese Patent application 200910138692.5, (7 pages).
EP Summons to Attend dated Aug. 23, 2012, for European Patent application 09251664.0, (6 pages).
JPO Office action dated Jan. 15, 2013, for Japanese Patent application 2011-140402, (2 pages).
JPO Office action dated Apr. 9, 2013, for Japanese Patent application 2012-76237, (2 pages).
U.S. Office action dated Jun. 23, 2011, for cross reference U.S. Appl. No. 12/350,101, (13 pages).
U.S. Office action dated Dec. 1, 2011, for cross reference U.S. Appl. No. 12/350,101, (14 pages).
U.S. Office action dated May 23, 2012, for cross reference U.S. Appl. No. 12/350,101, (15 pages).
U.S. Office action dated Feb. 28, 2013, for cross reference U.S. Appl. No. 12/409,375, (19 pages).

* cited by examiner

DISPLAY APPARATUS

CROSS-REFERENCE TO RELATED APPLICATIONS

This application claims the benefit of Korean Patent Application No. 10-2009-0072401, filed Aug. 6, 2009, in the Korean Intellectual Property Office, the disclosure of which is incorporated herein by reference.

BACKGROUND

1. Field

Aspects of the present invention relate to a display apparatus, and more particularly, to a display apparatus having an electrostatic capacitive-type touch panel function.

2. Description of the Related Art

Recently, the use of portable thin flat display apparatuses has increased considerably. Also, research has been conducted to obtain a thin flat display apparatus having a touch panel function. By having the touch panel function, a display apparatus can perform an input function in which a user touches a panel surface of the display apparatus with a finger or a pen.

Research has been conducted on display apparatuses having an internal electrostatic capacitive-type touch panel function. However, due to a structure of the display unit emitting visible light, and a structural accuracy of an encapsulating unit encapsulating the display unit in the display apparatus, mounting an electrostatic capacitive-type touch panel on the display apparatus reduces efficiency with respect to effective manufacturing and product characteristics.

Also, if a display apparatus having a touch panel function is used in an environment with incident sunlight, the contrast of the display apparatus considerably deteriorates due to the reflection of the sunlight, such that there is a limit in assuring a desired optical characteristic of the display apparatus.

SUMMARY

Aspects of the present invention provide a display apparatus having a touch panel function and an improved optical characteristic.

According to an aspect of the present invention, there is provided a display apparatus including a substrate; a display unit formed on the substrate and including a plurality of pixels; an encapsulation substrate disposed facing the display unit to encapsulate the display unit; an electrostatic capacitive pattern layer formed on the encapsulation substrate; and a black matrix layer formed between the substrate and the encapsulation substrate, and disposed to surround the plurality of pixels, wherein the plurality of pixels are disposed to correspond to the electrostatic capacitive pattern layer.

According to an aspect of the present invention, the electrostatic capacitive pattern layer may include a plurality of patterns, and the black matrix layer may include a first black matrix layer disposed in a space between the plurality of patterns of the electrostatic capacitive pattern layer and include a second black matrix layer formed on the electrostatic capacitive pattern layer.

According to an aspect of the present invention, the electrostatic capacitive pattern layer may be formed on a surface of the encapsulation substrate facing the display unit.

According to an aspect of the present invention, the electrostatic capacitive pattern layer may include a first pattern layer and a second pattern layer that is electrically insulated from the first pattern layer.

According to an aspect of the present invention, the first pattern layer may extend in a direction, and the second pattern layer may extend in another direction that is substantially perpendicular to the direction of the first pattern layer.

According to an aspect of the present invention, the first pattern layer may include a plurality of first pad units and a plurality of first connection units for connecting the plurality of first pad units which are adjacent to each other, and the second pattern layer may include a plurality of second pad units and a plurality of second connection units connecting the plurality of second pad units which are adjacent to each other.

According to an aspect of the present invention, each of the plurality of first pad units and each of the plurality of second pad units may have a diamond shape.

According to an aspect of the present invention, outlines of the plurality of first pad units and the plurality of second pad units may have a stepped shape so as to correspond to outlines of the plurality of pixels.

According to an aspect of the present invention, the display apparatus may further include a first insulating layer formed to cover the first pattern layer and the plurality of second pad units, wherein the plurality of second connection units connect the plurality of second pad units, which are adjacent to each other, via a plurality of contact holes formed in the first insulating layer.

According to an aspect of the present invention, the display apparatus may further include a second insulating layer formed on the first insulating layer so as to cover the plurality of second connection units.

According to an aspect of the present invention, the electrostatic capacitive pattern layer may include a transmissive conductive layer.

According to an aspect of the present invention, the electrostatic capacitive pattern layer may include one selected from the group consisting of indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO) and $In_2O_3$.

According to an aspect of the present invention, the each of the plurality of pixels may include a plurality of sub-pixels.

According to an aspect of the present invention, the display unit may include an organic light emitting device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
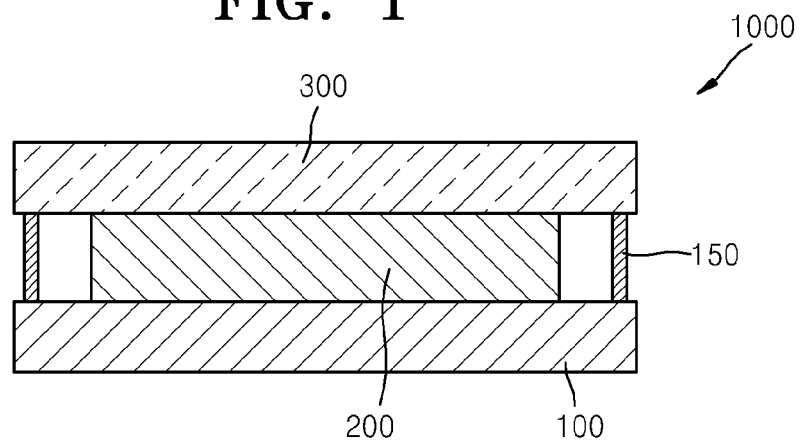
FIG. 1 is a cross-sectional view of a display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 2:
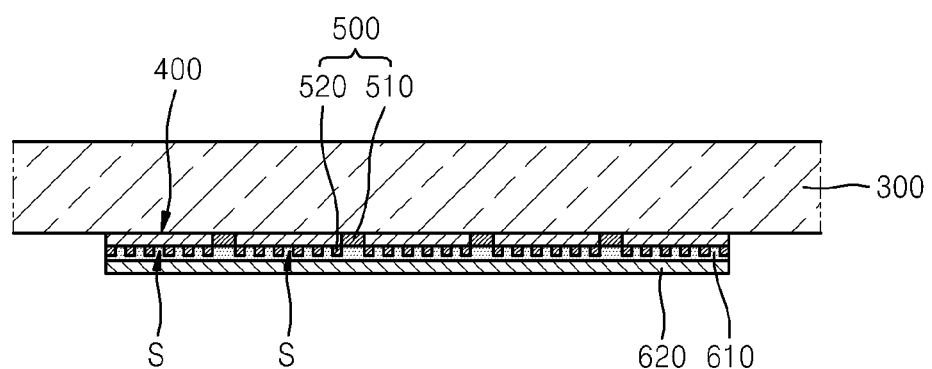
FIG. 2 is a magnified cross-sectional view of an encapsulation substrate of the display apparatus in FIG. 1.

FIG. 1 is a cross-sectional view of a display apparatus 1000 according to an embodiment of the present invention. FIG. 2 is a magnified cross-sectional view of an encapsulation substrate 300 of the display apparatus 1000 in FIG. 1. Referring to FIGS. 1 and 2, the display apparatus 1000, according to the present embodiment, includes a substrate 100, a display unit 200, the encapsulation substrate 300, an electrostatic capacitive pattern layer 400, and a black matrix layer 500.

The substrate 100 is formed of transparent glass containing $SiO_2$ as a main component, however, aspects of the present invention are not limited thereto, and the substrate 100 may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

The display apparatus 1000 is a bottom emission-type display apparatus or a top emission-type display apparatus. If the display apparatus 1000 is a bottom emission-type display apparatus in which an image is realized toward the substrate 100, the substrate 100 is formed of a transparent material. However, if the display apparatus 1000 of FIG. 1 is a top emission-type display apparatus in which an image is realized away from the substrate 100, the substrate 100 may be formed of a metal. When the substrate 100 is formed of a metal, the substrate 100 includes at least one material selected from the group consisting of iron, chromium, manganese, nickel, titanium, molybdenum, stainless steel (SUS), Invar alloys, Inconel alloys, and Kovar alloys, however, aspects of the present invention are not limited thereto, and the substrate 100 may also be formed of a metal foil or other suitable materials.

The display unit 200 is formed on the substrate 100. The display unit 200 is formed to emit visible light, and may include various types of devices such as a liquid crystal device, an electroluminescent device, or an organic light emitting device. However, aspects of the present invention are not limited thereto and other visible light emitting devices may be the display unit 200. The display unit 200 includes a plurality of pixels.

The encapsulation substrate 300 is disposed on the display unit 200. The encapsulation substrate 300 is disposed to face the substrate 100 and is capable of protecting the display unit 200 from external moisture or oxygen and is formed of a transparent material. The encapsulation substrate 300 is formed of a glass, a plastic and has a structure in which inorganic and organic materials are multi-layered. However, aspects of the present invention are not limited thereto, and the encapsulation substrate 300 may be formed of other suitable materials and structures. When the encapsulation substrate 300 is touched by a user the encapsulation substrate 300 allows the display apparatus 1000 to operate as a touch panel.

The substrate 100 and the encapsulation substrate 300 are attached to each other by using a sealant 150. A glass frit is used as the sealant 150. However, aspects of the present invention are not limited thereto, and an organic material, an inorganic material, or a mixture of the organic material and the inorganic material may be used as the sealant 150.

The electrostatic capacitive pattern layer 400, the black matrix layer 500, a first insulating layer 610, and a second insulating layer 620 are sequentially formed on a surface of the encapsulation substrate 300 so as to face the display unit 200. The electrostatic capacitive pattern layer 400 includes a plurality of patterns formed of a material that is conductive and highly transparent so as to transmit the visible light generated in the display unit 200.

The black matrix layer 500 is disposed between the encapsulation substrate 300 and the display unit 200 so as to surround the pixels of the display unit 200. Referring to FIG. 2, the black matrix layer 500 includes a first black matrix layer 510 and a second black matrix layer 520. The black matrix layer 510 is disposed on the encapsulation substrate 300 in spaces in the electrostatic capacitive pattern layer 400. The second black matrix layer 520 is formed on the electrostatic capacitive pattern layer 400.

The black matrix layer 500 is disposed so as to surround the pixels of the display unit 200, in such a manner that the black matrix layer 500 prevents diffusion of light without disturbing the travel of the visible light generated in each pixel. Additionally, the black matrix layer 500 prevents the reflection of an external light, and thus improves a contrast of the display apparatus 1000. Furthermore, the black matrix layer 500 improves an optical characteristic of the display apparatus 1000. By forming the second black matrix layer 520 of the black matrix layer 500, a plurality of spaces S are formed so as to respectively correspond to the pixels of the display unit 200.

Figure 3:
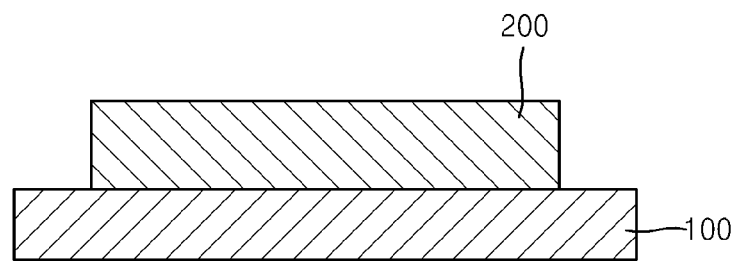
FIG. 3 is a cross-sectional view of a display unit of the display apparatus in FIG. 1.
Figure 4:
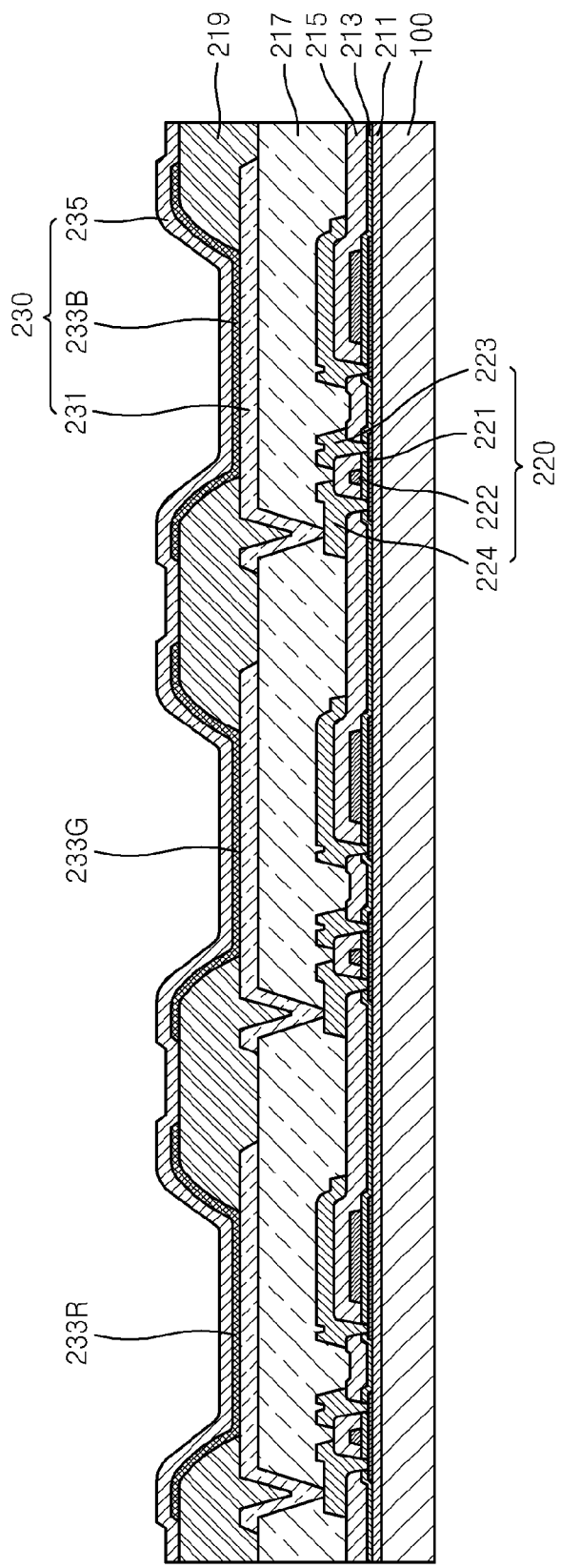
FIG. 4 is a magnified cross-sectional view illustrating an encapsulation case in which the display unit in FIG. 3 includes an active matrix (AM) organic light emitting device.

FIG. 3 is a cross-sectional view of the display unit 200 of the display apparatus 1000 in FIG. 1, and FIG. 4 is a magnified cross-sectional view of the display unit 200 in FIG. 3. As described above, the display apparatus 1000, according to the present embodiment, includes the display unit 200 that includes one of various types of devices, e.g., the display apparatus 1000 may have the display unit 200 including the OLED.

The OLED included in the display unit 200 includes a passive matrix OLED (PMOLED) or an active matrix OLED (AMOLED), and the encapsulation case in which the OLED is included in the display unit 200 includes the AMOLED as shown in FIG. 4. FIG. 4 is a magnified cross-sectional view for describing a case in which the display unit 200 in FIG. 3 includes the AMOLED. For convenience of description, FIG. 4 illustrates one pixel having three sub-pixels.

Referring to FIG. 4, a thin-film transistor (TFT) 220 and an OLED 230 are formed on the substrate 100. To be more specific, the substrate 100 is formed as a plane surface, and then, in order to prevent impurities from penetrating into the substrate 100, a buffer layer 211 is formed on the substrate 100. The buffer layer 211 is formed of $SiO_2$ and/or SiNx. However, aspects of the present invention are not limited thereto and the buffer layer may be formed of other suitable materials.

The TFT 220 is formed on the buffer layer 211. The TFT 220 is formed corresponding to each of the three sub-pixels, and one of the TFTs 220 formed at each of the three sub-pixels is electrically connected to the respective OLED 230 of the corresponding sub-pixel so as to function as a driving circuit. The TFT 220 includes an active layer 221, a gate electrode 222, a source electrode 223, and a drain electrode 224.

The active layer 221 having a predetermined pattern is formed on the buffer layer 211. The active layer 221 is formed as an inorganic semiconductor including amorphous silicon or poly-silicon, or an organic semiconductor, and includes a source region, a drain region, and a channel region.

The source and drain regions of the active layer 221 are formed in a manner such that the active layer 221 formed of amorphous silicon or poly-silicon is doped with an impurity. If the active layer 221 is doped with Group 3 elements including boron (B), a p-type semiconductor is formed, or if the active layer 221 is doped with Group 5 elements including nitrogen (N), an n-type semiconductor is formed. However, aspects of the present invention are not limited thereto and other suitable elements may be used to form the active layer 221.

A gate-insulating layer 213 is formed on the active layer 221, and the gate electrode 222 is formed on a predetermined portion of a top surface of the gate-insulating layer 213. The gate-insulating layer 213 insulates the active layer 221 from the gate electrode 222, and is formed of an organic material or an inorganic material including SiNx, and $SiO_2$. However, aspects of the present invention are not limited thereto and the gate-insulating layer 213 may be formed of other suitable materials.

The gate electrode 222 is formed of a metal selected from the group consisting of Au, Ag, Cu, Ni, Pt, Pd, Al, and Mo, or is formed of a metal alloy such as Al—Nd alloy, Mo—W alloy. However, aspects of the present invention are not limited thereto, and the gate may be formed of various materials, in consideration of adhesion to an adjacent layer, a planarity of a layer whereon the gate electrode 222 is formed, electrical resistance, processability or the like. The gate electrode 222 is connected to a gate line (not shown) that applies a TFT ON/OFF signal to the gate electrode 222.

An interlayer insulating layer 215 is formed on the gate electrode 222 with contact holes. The interlayer insulating layer 215 is formed in such a manner that the source electrode 223 and the drain electrode 224 respectively contact the source region and the drain region of the active layer 221 via the contact holes. The source and drain electrodes 223 and 224 are formed of a metal selected from the group consisting of Au, Pd, Pt, Ni, Rh, Ru, Ir and Os, or are formed of a metal alloy containing at least two metals from the group consisting of Al, Mo, Al—Nd alloy, Mo—W alloy. However, aspects of the present invention are not limited thereto, and the source and drain electrodes 223 and 224 may be formed of other similar materials.

The TFT 220 is covered with a passivation layer 217 for protection. The passivation layer 217 is an inorganic insulating layer and/or an organic insulating layer may be used, wherein the inorganic insulating layer includes $SiO_2$, SiNx, SiON, $Al_2O_3$, $TiO_2$, $Ta_2O_5$, $HfO_2$, $ZrO_2$, BST, or PZT, and the organic insulating layer includes polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a mixture of any of these. The passivation layer 217 is formed as a multi-stack including the inorganic insulating layer and the organic insulating layer. However, aspects of the present invention are not limited thereto and the passivation layer 217 may be formed of other similar materials and in different configurations.

A via hole (not shown) is formed in the passivation layer 217 so as to expose the drain electrode 224, and the OLED 230 is formed on the passivation layer 217. The OLED 230 includes a first electrode 231, intermediate layers 233R, 233G, and 233B, and a second electrode 235. The first electrode 231 is electrically connected to the drain electrode 224 via the via hole (not shown).

A pixel-defining layer 219 is formed of an insulating material so as to cover the first electrode 231. By forming a predetermined opening in the pixel-defining layer 219, the first electrode 231 is exposed. The intermediate layers 233R, 233G, and 233B are formed on the exposed first electrode 231. The second electrode 235 is formed to cover all pixels. The first electrode 231 is an anode electrode, and the second electrode 235 is a cathode electrode. However, aspects of the present invention are not limited thereto and the first electrode 231 may be the cathode electrode, and the second electrode 235 may be the anode electrode.

For convenience of description, a structure of the intermediate layers 233R, 233G, and 233B, which are now to be described, corresponds to a case in which the first electrode 231 functions as the anode electrode and the second electrode 235 functions as the cathode electrode.

The intermediate layers 233R, 233G, and 233B include an organic emission layer (not shown) so as to emit visible light, and the organic emission layer includes either a low molecular weight organic material or a polymer organic material. However, aspects of the present invention are not limited thereto and the organic emission layer may be formed of other suitable materials.

In the case where the organic emission layer of the intermediate layers 233R, 233G, and 233B is formed of the low molecular weight organic material, a hole transport layer (HTL) and a hole injection layer (HIL) may be stacked below the organic emission layer toward the first electrode 231, and an electron transport layer (ETL) and an electron injection layer (EIL) may be stacked on the organic emission layer toward the second electrode 235. In addition to these layers, various layers may be stacked on or below the organic emission layer. The low molecular weight organic material is formed of copper phthalocyanine (CuPc), N,N'-Di(naphthalene-1-yl)-N,N'-diphenyl-benzidine (NPB), or tris-8-hydroxyquinoline aluminum ($Alq_3$. However, aspects of the present invention are not limited thereto and other suitable materials may be used.

In the case where the organic emission layer of the intermediate layers 233R, 233G, and 233B is formed of the polymer organic material, a polymer HTL is stacked on the organic emission layer in a direction towards the first electrode 231. The polymer HTL is formed of poly(3,4-ethylenedioxythiophene) (PEDOT) or polyaniline (PANI) and formed on the first electrode 231 by using an inkjet printing method or a spin coating method. The polymer organic emission layer is formed of poly-phenylenevinylene (PPV), soluble PPV's, cyano-PPV, polyfluorene, or the like by using a common method such as an inkjet printing method, a spin coating method or a thermal transfer method using laser, and may form a color pattern. However, aspects of the present invention are not limited thereto, and the organic emission layer may be formed of other suitable materials and may be formed using other suitable methods.

Referring to FIG. 4, the three sub-pixels respectively emitting a red color, a green color, and a blue color are illustrated. The intermediate layer 233R includes an organic emission layer for emitting red visible light, the intermediate layer 233G includes an organic emission layer for emitting green visible light, and the intermediate layer 233B includes an organic emission layer for emitting blue visible light.

Figure 5:
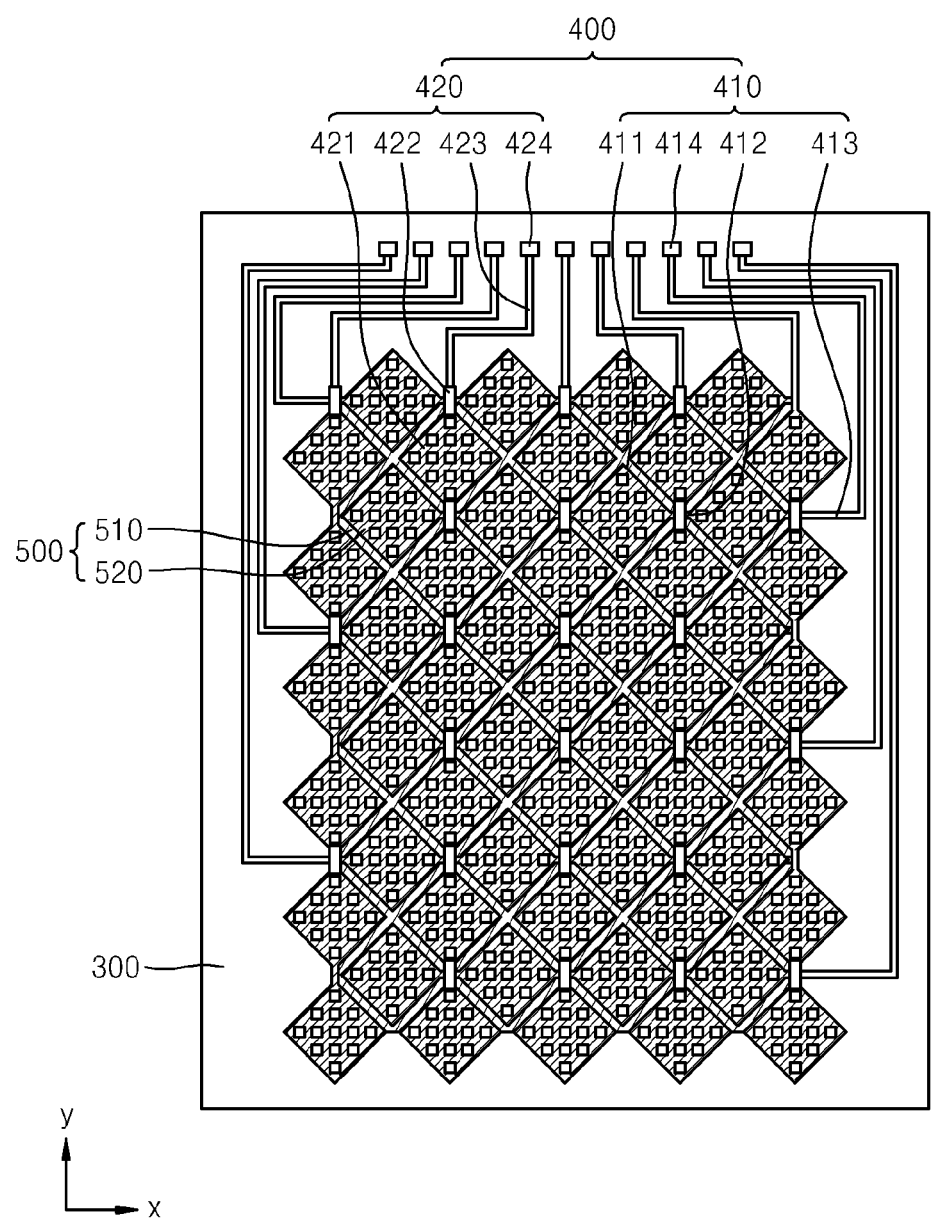
FIG. 5 is a bottom plane view of an encapsulation substrate in FIG. 2.
Figure 6A:
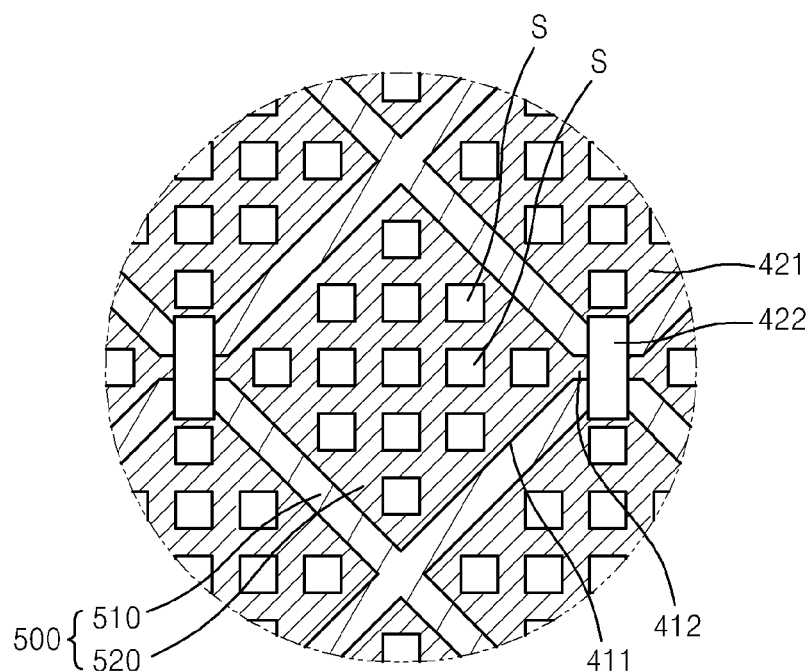
FIG. 6A is a magnified view of a portion of an electrostatic capacitive pattern layer of FIG. 5.
Figure 6B:
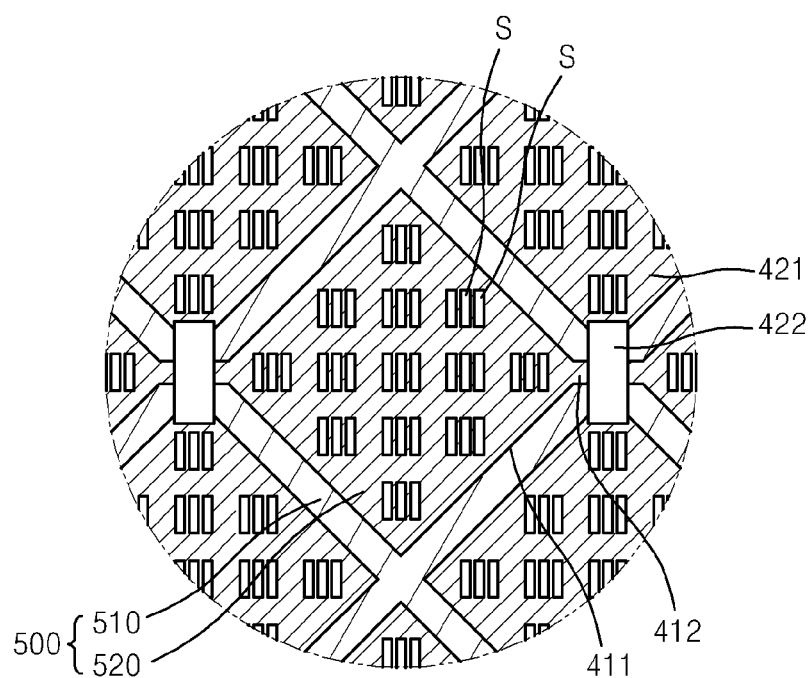
FIGS. 6B and 6C are modified examples of the electrostatic capacitive pattern layer of FIG. 6A.
Figure 6C:
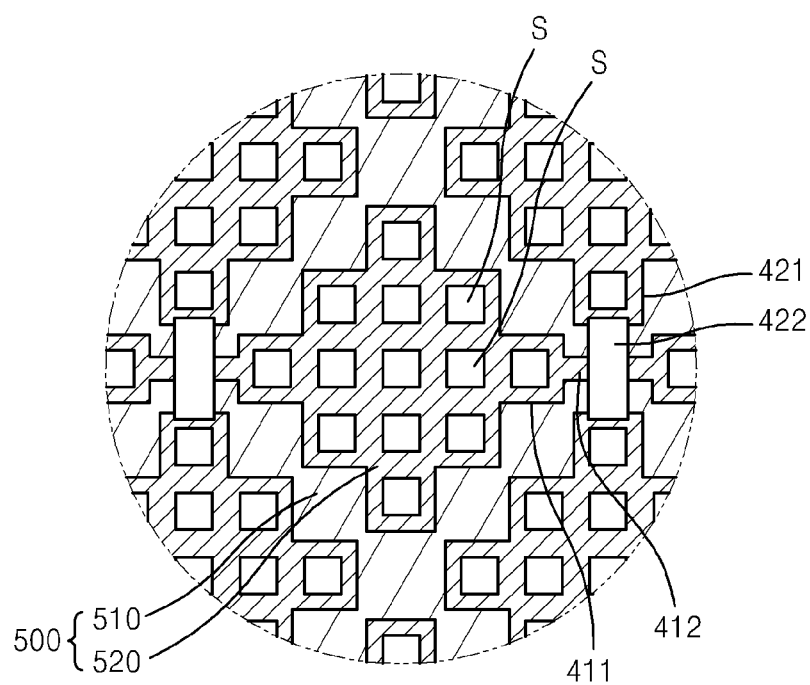

FIG. 5 is a bottom plane view of the encapsulation substrate 300 in FIG. 2. FIG. 6A is a magnified view of a portion of the electrostatic capacitive pattern layer 400 in FIG. 5. FIGS. 6B and 6C are modified examples of the electrostatic capacitive pattern layer 400 in FIG. 6A. For convenience of description, the first insulating layer 610 and the second insulating layer 620 are not illustrated in FIG. 5.

The electrostatic capacitive pattern layer 400 formed on the encapsulation substrate 300 includes a first pattern layer 410 and a second pattern layer 420.

The first pattern layer 410 includes a plurality of first pad units 411 formed to be parallel to each other along a first direction (the X direction in FIG. 5), a plurality of first connection units 412, a first extending unit 413, and a first contact unit 414.

The second pattern layer 420 includes a plurality of second pad units 421 formed to be parallel to each other along a second direction (the Y direction in FIG. 5) that is substantially perpendicular to the first direction, a plurality of second connection units 422, a second extending unit 423, and a second contact unit 424.

The first pattern layer 410 and the second pattern layer 420 are alternately disposed. That is, a plurality of the first pattern layers 410 are formed in parallel with their opposing corners facing each other along the first direction (the X direction in FIG. 5) on the surface of the encapsulation substrate 300, and a plurality of the second pattern layers 420 are formed in parallel with their opposing corners facing each other along the second direction (the Y direction in FIG. 5) between the first pattern layers 410.

The black matrix layer 500 includes the first black matrix layer 510 and the second black matrix layer 520. The first black matrix layer 510 is formed on the encapsulation substrate 300 and in spaces between the first pattern layers 410 and the second pattern layers 420. The second black matrix layer 520 is formed on the electrostatic capacitive pattern layer 400.

Since the black matrix layer 500 is disposed so as to surround pixels of the display unit 200, the black matrix layer 500 is formed in all regions except for portions that correspond to the pixels of the display unit 200.

Referring to FIG. 6A, portions S, in which the black matrix layer 500 is not formed, correspond to the pixels of the display unit 200. However, aspects of the present invention are not limited thereto, and sub-pixels constituting each pixel may correspond to the portions S.

The modified example of FIG. 6B illustrates a case in which each portion S is disposed to correspond to each sub-pixel. To be more specific, portions S in FIG. 6B respectively correspond to regions through which visible light is emitted from the intermediate layers 233R, 233G, and 233B of red, green, and blue sub-pixels as illustrated in FIG. 4.

Referring to FIGS. 6A and 6B, the first pad unit 411 and the second pad unit 421 have a diamond shape. However, aspects of the present invention are not limited thereto, and thus the first pad unit 411 and the second pad unit 421 may have various shapes. FIG. 6C illustrates the modified example of the encapsulation substrate 300 in FIG. 6A.

Referring to FIG. 6C, the first pad unit 411 and the second pad unit 421 are formed to have a polygonal shape having a stepped outline corresponding to a shape of a pixel or a sub-pixel of the display unit 200.

Figure 7:
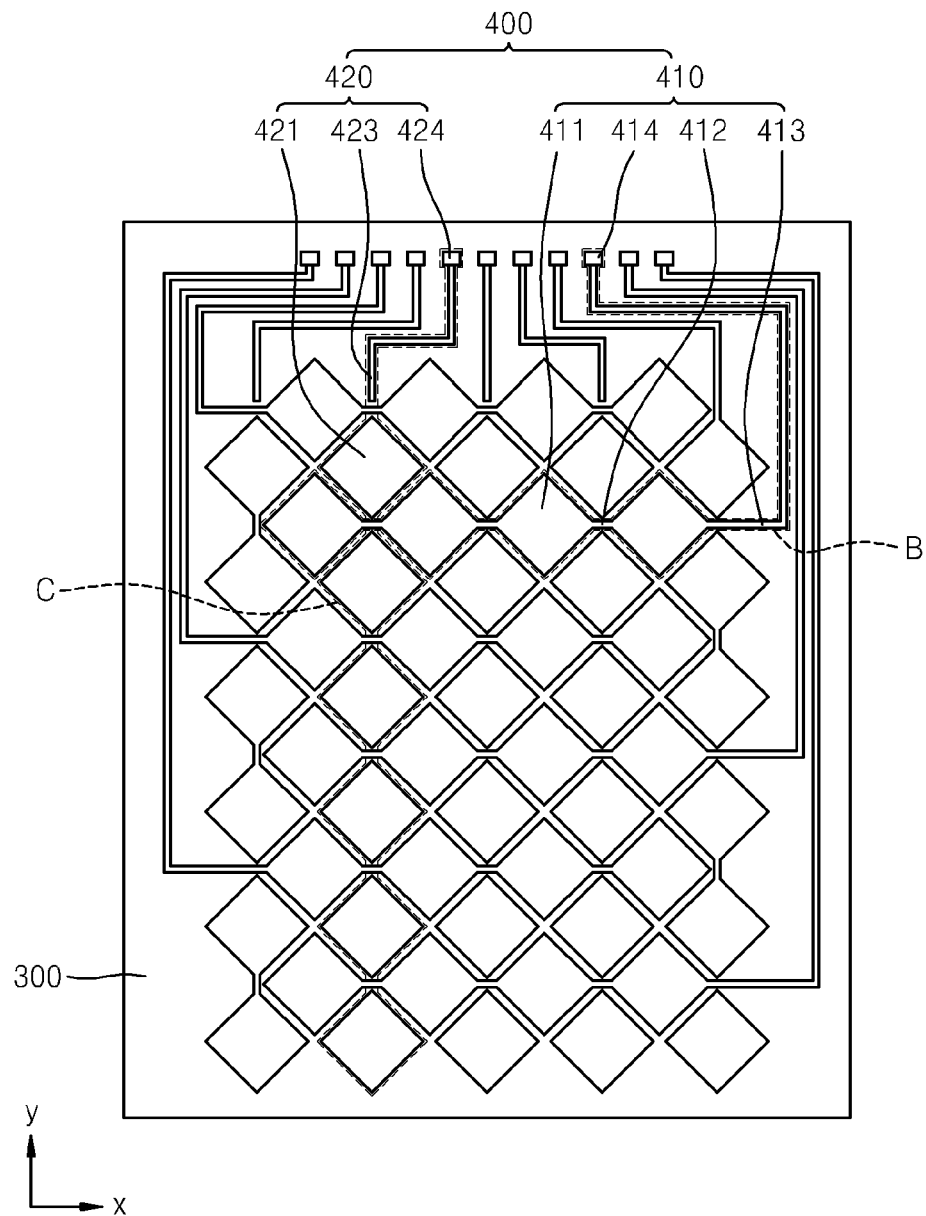
FIG. 7 is a schematic diagram for describing the electrostatic capacitive pattern layer of FIG. 5.

FIG. 7 is a schematic diagram describing the electrostatic capacitive pattern layer 400 of FIG. 5. In order to illustrate a structure of the electrostatic capacitive pattern layer 400, the black matrix layer 500 and the second connection units 422 in FIG. 5 are not illustrated.

Referring to reference character B indicating one of the rows of the first pattern layers 410 extending the first direction, each of the rows of the first pattern layers 410 includes the first pad units 411, the first connection units 412, the first extending unit 413, and the first contact unit 414.

The first pad units 411 are formed in a row extending along the first direction, i.e., the X direction in FIG. 7. The first pad units 411 have a diamond shape, however, aspects of the present invention are not limited thereto and the first pad units 411 may be formed to have the stepped outline as illustrated in FIG. 6C. The first connection units 412 are formed between the first pad units 411, and respectively connect the first pad units 411 that are adjacent to each other.

The first extending unit 413 extends from an end of each of the first pad units 411 of the rows of the first pattern layers 410. The first extending unit 413 may be formed to extend in the second direction, i.e., the Y direction in FIG. 7, such that the first extending units 413 may gather at one end of the encapsulation substrate 300, that is, an upper end of the encapsulation substrate 300 in FIG. 7.

Reference character C indicates one of the columns of the second pattern layers 420, each of the columns of the second pattern layers 420 includes the second pad units 421, the second extending unit 423, and the second contact unit 424. The second pad units 421 are formed in a column along the second direction. Referring to FIG. 7, the second pad units 421 have a diamond shape, however, aspects of the present invention are not limited thereto and the second pad units 421 may be formed to have the stepped outline as illustrated in FIG. 6C.

Figure 8:
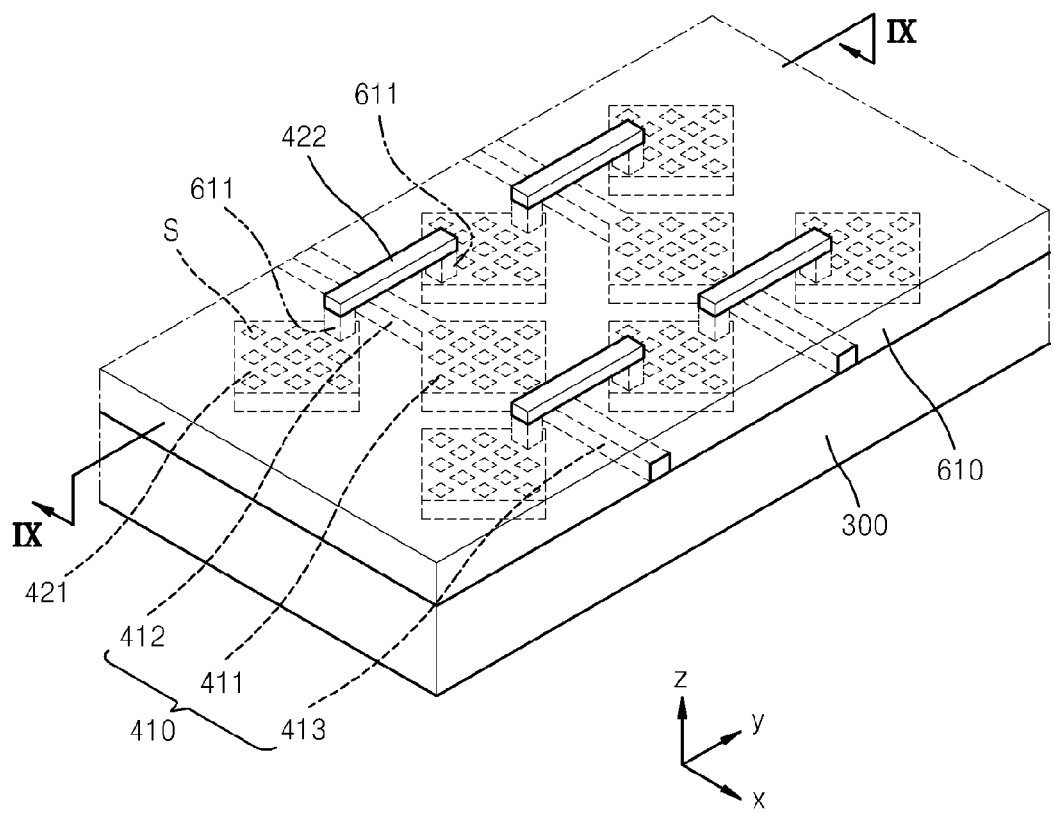
FIG. 8 is a bottom perspective view of a portion of the encapsulation substrate of FIG. 5.

The second pad units 421 are connected to each other by the second connection units 422 which are shown in FIG. 8. Meanwhile, each second extending unit 423 respectively extends from an end of each of the second pad units 421 of the columns of the second pattern layers 420. The second extending unit 423 is formed to extend in the second direction, such that the second extending units 423 gather at one end of the encapsulation substrate 300, that is, the upper end of the encapsulation substrate 300 in FIG. 7. The second contact unit 424 is formed at an end of the second extending unit 423.

FIG. 8 is a bottom perspective view of a portion of the encapsulation substrate of FIG. 5. For convenience of description, the second insulating layer 620 is not illustrated in FIG. 8. Referring to FIG. 8, the first insulating layer 610 is formed to cover the first pattern layer 410 and the second pad units 421.

A plurality of contact holes 611 are formed at predetermined positions in the first insulating layer 610, e.g., at positions that correspond to opposing corners of the second pad units 421. The second connection units 422 are formed to fill the contact holes 611 of the first insulating layer 610. Via the contact holes 611, the second pad units 421 are connected to the second connection units 422, which electrically connect the second pad units 421 that are adjacent to each other.

In order to insulate the first pattern layer 410 from the second pattern layer 420, the first insulating layer 610 may be formed of various materials. For example, an organic material or an inorganic material may be used, e.g., a silicon oxide may be used. However, aspects of the present invention are not limited thereto and other similar materials may be used. According to the structures of the first pattern layer 410 and the second pattern layer 420, the first pattern layer 410 and the second pattern layer 420 are alternately disposed and do not cross each other, and thus, a short circuit between the first pad unit 411 and the second pad unit 421 may be prevented.

Figure 9:
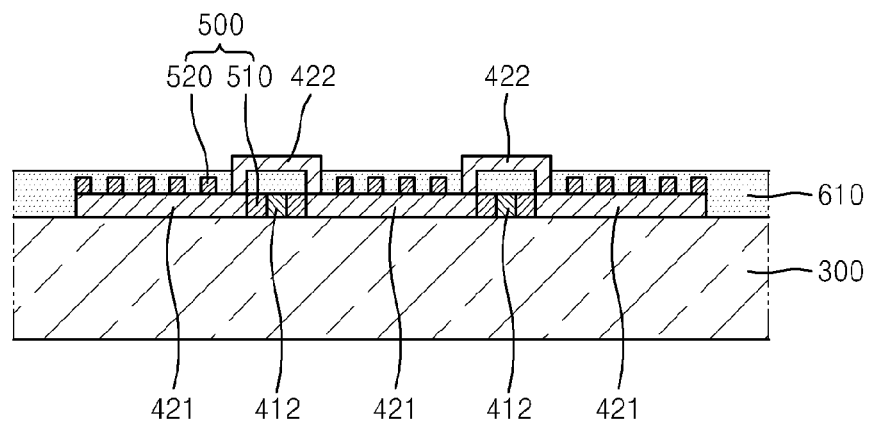
FIG. 9 is a cross-sectional view taken along line IX-IX in FIG. 8.

FIG. 9 is a cross-sectional view taken along line IX-IX in FIG. 8. Referring to FIG. 9, the first black matrix layer 510 is formed in a space between the second pad unit 421 and the first connection unit 412, and the second black matrix layer 520 is formed on the second pad unit 421. As described above, the first black matrix layer 510 and the second black matrix layer 520 are formed to surround pixels or sub-pixels of the display unit 200.

The first pattern layer 410 and the second pattern layer 420 are formed as conductive patterns by using a high transmissive material through which visible light can be transmitted, wherein the visible light is generated in the display unit 200. For example, the first pattern layer 410 and the second pattern layer 420 are formed of transparent materials such as indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO) or $In_2O_3$. The first pattern layer 410 is formed by using a photolithography process. That is, an ITO layer formed by using a deposition method, a spin coating method, a sputtering method, or an inkjet method is patterned to form the first pattern layer 410. However, aspects of the present invention are not limited thereto and the first pattern layer 410 and the second pattern layer 420 may be formed of other suitable materials, and the first pattern layer 410 may be formed using other suitable processes or methods.

The first contact unit 414 may be connected to a corresponding data line (not shown) of the display unit 200 via a corresponding conductive member. In addition, similar to the first contact unit 414, the second contact unit 424 is connected to a corresponding data line of the display unit 200 via a corresponding conductive member.

The first contact unit 414 and the second contact unit 424 are formed of a material having a low resistance, and may include one material selected from the group consisting of Mo, a Mo alloy, Al, and Ti. However, aspects of the present invention are not limited thereto and other similar materials may be used for the first contact unit 414 and the second contact unit 424.

When an object, such as a user's finger, approaches or touches a surface, that is, a touch panel of the display apparatus 1000, the display apparatus 1000 interprets a change of electrostatic capacitance caused by the approach or contact of the object, thereby sensing a touch. Then, the organic light emitting display apparatus outputs coordinates and a pressure value of a location at which the object approached or touched the display apparatus 1000.

To be more specific, before the touch of the user, a voltage exists in the second electrode 235 of the display unit 200. Thus, the electrostatic capacitive pattern layer 400 and the second electrode 235 form one capacitor, and an electrostatic capacitance between the electrostatic capacitive pattern layer 400 and the second electrode 235 is maintained to be constant. At this time, if the user touches the encapsulation substrate 300, the user's finger and the electrostatic capacitive pattern layer 400 form another capacitor. Thus, these two capacitors are connected in series, and the entire electrostatic capacitance changes according to the touch by the user. By sensing the position where the change in the electrostatic capacitance occurs, and sensing a magnitude of the change, the touch panel function can be implemented.

According to the embodiment of the present invention, by disposing the black matrix layer 500 so as to surround pixels that emit visible light in the display unit 200, contrast of the display apparatus 1000 is improved. Also, the pixels of the display unit 200 are formed to correspond to the electrostatic capacitive pattern layer 400 so that the visible light generated in the display unit 200 can have a uniform optical characteristic. Consequently, an optical characteristic of the display apparatus 1000 is improved.

In this manner, according to the embodiment of the present invention, it is possible to realize the touch panel function without increasing the thickness of the touch panel. Also, the electrostatic capacitive pattern layer 400 is formed on an inner surface of the encapsulation substrate 300, slim etching is possible, and the first pattern layer 410 and the second pattern layer 420 are easily manufactured.

The display apparatus 1000, according to the embodiment of the present invention, may easily implement the touch panel function. Also, the display apparatus 1000, according to the embodiment of the present invention, increases in contrast, thereby assuring a desired optical characteristic.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display apparatus comprising:
a substrate;
a display unit formed on the substrate and including a plurality of pixels;
an encapsulation substrate disposed facing the display unit to encapsulate the display unit;
an electrostatic capacitive pattern layer formed on the encapsulation substrate; and
a black matrix layer formed between the substrate and the encapsulation substrate and disposed to surround the plurality of pixels, the black matrix layer comprising:
a first black matrix layer; and
a second black matrix layer,
the first black matrix layer being offset from the second black matrix layer along a first direction parallel to the electrostatic capacitive pattern layer and along a second direction perpendicular to the electrostatic capacitive pattern layer,
wherein the plurality of pixels are disposed to correspond to the electrostatic capacitive pattern layer,
wherein the electrostatic capacitive pattern layer comprises a plurality of patterns, and
wherein the first black matrix layer is disposed in a space between the plurality of patterns of the electrostatic capacitive pattern layer; and
the second black matrix layer is formed on the electrostatic capacitive pattern layer.

2. The display apparatus of claim 1, wherein the electrostatic capacitive pattern layer is formed on a surface of the encapsulation substrate facing the display unit.

3. The display apparatus of claim 1, wherein the plurality of patterns of the electrostatic capacitive pattern layer comprises:
a first pattern layer; and a second pattern layer that is electrically insulated from the first pattern layer.

4. The display apparatus of claim 3, wherein the first pattern layer extends in a direction parallel to the first direction, and the second pattern layer extends in another direction that is parallel to the first direction and substantially perpendicular to the direction of the first pattern layer.

5. The display apparatus of claim 3, wherein the first pattern layer comprises a plurality of first pad units and a plurality of first connection units connecting adjacent ones of the plurality of first pad units to each other, and the second pattern layer comprises a plurality of second pad units and a plurality of second connection units connecting adjacent ones of the plurality of second pad units to each other.

6. The display apparatus of claim 5, wherein each of the plurality of first pad units and each of the plurality of second pad units have a diamond shape.

7. The display apparatus of claim 5, wherein outlines of the plurality of first pad units and the plurality of second pad units have a stepped shape so as to correspond to outlines of the plurality of pixels.

8. The display apparatus of claim 5, further comprising a first insulating layer formed to cover the first pattern layer and the plurality of second pad units,
wherein the plurality of second connection units connect adjacent ones of the plurality of second pad units via a plurality of contact holes formed in the first insulating layer.

9. The display apparatus of claim 8, further comprising a second insulating layer formed on the first insulating layer so as to cover the plurality of second connection units.

10. The display apparatus of claim 1, wherein the electrostatic capacitive pattern layer comprises a transmissive conductive layer.

11. The display apparatus of claim 1, wherein the electrostatic capacitive pattern layer comprises one of the group consisting of indium tin oxide (ITO), indium zinc oxide (IZO), indium oxide (10), Ga-doped oxide (GZO), zinc oxide (ZnO), AI-doped oxide (AZO), fluorine doped tin oxide (FTO), antimony doped tin oxide (ATO) and In$_2$O$_3$.

12. The display apparatus of claim 1, wherein each of the plurality of pixels comprises a plurality of sub-pixels.

13. The display apparatus of claim 1, wherein the display unit comprises an organic light emitting device.

14. A method of adding an electrostatic capacitive-type touch panel function in a display apparatus including a substrate, a display unit, and an encapsulation substrate, the method comprising:
forming an electrostatic capacitive pattern layer on the encapsulation substrate;
forming a black matrix layer on the electrostatic capacitive layer, the black matrix layer comprising a first black matrix layer and a second black matrix layer, the first black matrix layer being offset from the second black matrix layer along a first direction parallel to the electrostatic capacitive pattern layer and along a second direction perpendicular to the electrostatic capacitive pattern layer;
forming an insulating layer on the black matrix layer;
forming the display unit including a plurality of pixels to emit light, the display unit being formed on the substrate; and
disposing the encapsulation substrate on the display unit so that the electrostatic capacitive pattern layer faces the display unit,
wherein the electrostatic capacitive pattern layer comprises:
a first pattern layer extending in a third direction parallel to the first direction; and
a second pattern layer extending in a fourth direction parallel to the first direction and substantially perpendicular to the first pattern layer,
wherein the second pattern layer is electrically insulated from the first pattern layer, and
wherein the first black matrix layer is disposed in spaces between the first pattern layer and the second pattern layer.

15. The method of claim 14, wherein the display unit comprises an organic light emitting device.

16. The method of claim 14, wherein the first pattern layer comprises a plurality of first pad units and a plurality of first connection units connecting adjacent ones of the plurality of first pad units to each other, and the second pattern layer comprises a plurality of second pad units and a plurality of second connection units connecting adjacent ones of the plurality of second pad units to each other.

17. The method of claim 16, wherein the plurality of first pad units and the plurality of second pad units have a diamond shape.

18. The method of claim 16, wherein outlines of the plurality of first pad units and the plurality of second pad units have a stepped shape so as to correspond to outlines of the plurality of pixels.

19. The method of claim 16, further comprising a first insulating layer formed to cover the first pattern layer and the plurality of second pad units,
wherein the plurality of second connection units connect adjacent ones of the plurality of second pad units via a plurality of contact holes formed in the first insulating layer.

20. The method of claim 19, further comprising a second insulating layer formed on the first insulating layer so as to cover the plurality of second connection units.

21. A method of adding an electrostatic capacitive-type touch panel function in a display apparatus including a substrate, a display unit, and an encapsulation substrate, the method comprising:
forming an electrostatic capacitive pattern layer on the encapsulation substrate;
forming a black matrix layer on the electrostatic capacitive layer, the black matrix layer comprising a first black matrix layer and a second black matrix layer, the first black matrix layer being offset from the second black matrix layer along a first direction parallel to the electrostatic capacitive pattern layer and along a second direction perpendicular to the electrostatic capacitive pattern layer;
forming an insulating layer on the black matrix layer;
forming the display unit including a plurality of pixels to emit light, the display unit being formed on the substrate; and
disposing the encapsulation substrate on the display unit so that the electrostatic capacitive pattern layer faces the display unit,
wherein the electrostatic capacitive pattern layer comprises:
a first pattern layer extending in a third direction parallel to the first direction; and
a second pattern layer extending in a fourth direction parallel to the first direction and substantially perpendicular to the first pattern layer,
wherein the second pattern layer is electrically insulated from the first pattern layer, and wherein the second black matrix layer is disposed on the first pattern layer and the second pattern layer.

22. The method of claim 14, wherein the electrostatic capacitive pattern layer comprises one of the group consisting of indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO) and $In_2O_3$.

* * * * *